US006498418B2

(12) United States Patent
Rueger

(10) Patent No.: US 6,498,418 B2

(45) Date of Patent: Dec. 24, 2002

(54) FUEL INJECTION SYSTEM

(75) Inventor: Johannes-Jörg Rueger, Vaihingen/enz (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/824,192

(22) Filed: Apr. 2, 2001

(65) Prior Publication Data

US 2002/0000761 A1 Jan. 3, 2002

(30) Foreign Application Priority Data

Apr. 1, 2000 (EP) ............................................ 00106965

(51) Int. Cl.[7] .......................... F02D 41/22; H01L 41/04

(52) U.S. Cl. .................................................. 310/316.03

(58) Field of Search ..................................... 310/316.03

(56) References Cited

U.S. PATENT DOCUMENTS 5,013,955 A * 5/1991 Hara et al. ............. 310/316.03
5,097,171 A 3/1992 Yutaka et al. .......... 310/316.03
5,241,933 A * 9/1993 Morikawa ............... 123/198 D
5,376,854 A 12/1994 Yoshito ................. 310/316.01
6,109,245 A * 8/2000 Egger et al. ........... 310/316.01
6,275,765 B1 * 8/2001 Divljakovic et al. ........ 701/102

FOREIGN PATENT DOCUMENTS

| | | | |
|---|---|---|---|
| DE | 38 23 182 | 1/1990 | F02D/41/22 |
| DE | 197 29 844 | 1/1999 | F02M/51/00 |
| DE | 197 42 073 | 3/1999 | F02M/51/06 |
| EP | 0 358 972 | 3/1990 | F02D/41/20 |
| EP | 0 371 469 | 6/1990 | H01L/41/04 |
| EP | 0 379 182 | 7/1990 | H01L/41/08 |
| FR | 2776087 | 9/1999 | G05F/1/46 |
| WO | WO 99/67527 | 12/1994 | F02M/15/00 |

* cited by examiner

*Primary Examiner*—Thomas M. Dougherty
(74) *Attorney, Agent, or Firm*—Kenyon & Kenyon

(57) ABSTRACT

The invention describes a fuel injection system comprising a piezoelectric element for controlling an amount of injected fuel, by charging and discharging the piezoelectric element using a driving circuitry, and a current diagnosis unit capable of detecting a fault of a current flowing in the driving circuitry within 10 $\mu$sec of the fault occurring.

25 Claims, 6 Drawing Sheets

FUEL INJECTION SYSTEM

The present invention relates to an apparatus as defined in the preamble of claim 1, and a method as defined in the preamble of claim 7, i.e. an apparatus and method for detecting a short circuit to chassis ground when driving piezoelectric elements.

Piezoelectric elements can be used as actuators because, as is known, they possess the property of contracting or expanding as a function of a voltage applied thereto or occurring therein.

The practical implementation of actuators using piezoelectric elements proves to be advantageous in particular if the actuator in question must perform rapid and/or frequent movements.

The use of piezoelectric elements as actuators proves to be advantageous, inter alia, in fuel injection nozzles for internal combustion engines. Reference is made, for example, to EP 0 371 469 B1 and to EP 0 379 182 B1 regarding the usability of piezoelectric elements in fuel injection nozzles.

Piezoelectric elements are capacitative elements which, as already partially alluded to above, contract and expand in accordance with the particular charge state or the voltage occurring therein or applied thereto. In the example of a fuel injection nozzle, expansion and contraction of piezoelectric elements is used to control valves that manipulate the linear strokes of injection needles. The use of piezoelectric elements with double acting, double seat valves to control corresponding injection needles in a fuel injection system is shown in German patent applications DE 197 42 073 A1 and DE 197 29 844 A1, which are incorporated herein in their entirety.

Fuel injection systems using piezoelectric elements are characterized by the fact that, to a first approximation, piezoelectric elements exhibit a proportional relationship between applied voltage and the linear expansion. In a fuel injection nozzle, for example, implemented as a double acting, double seat valve to control the linear stroke of a needle for fuel injection into a cylinder of an internal combustion engine, the amount of fuel injected into a corresponding cylinder is a function of the time the valve is open, and in the case of the use of a piezoelectric element, the activation voltage applied to the piezoelectric element.

FIG. 6 is a schematic representation of a fuel injection system using a piezoelectric element 2010 as an actuator. Referring to FIG. 6, the piezoelectric element 2010 is electrically energized to expand and contract in response to a given activation voltage. The piezoelectric element 2010 is coupled to a piston 2015. In the expanded state, the piezoelectric element 2010 causes the piston 2015 to protrude into a hydraulic adapter 2020 which contains a hydraulic fluid, for example fuel. As a result of the piezoelectric element's expansion, a double acting control valve 2025 is hydraulically pushed away from hydraulic adapter 2020 and the valve plug 2035 is extended away from a first closed position 2040. The combination of double acting control valve 2025 and hollow bore 2050 is often referred to as double acting, double seat valve for the reason that when piezoelectric element 2010 is in an unexcited state, the double acting control valve 2025 rests in its first closed position 2040. On the other hand, when the piezoelectric element 2010 is fully extended, it rests in its second closed position 2030. The later position of valve plug 2035 is schematically represented with ghost lines in FIG. 6.

The fuel injection system comprises an injection needle 2070 allowing for injection of fuel from a pressurized fuel supply line 2060 into the cylinder (not shown). When the piezoelectric element 2010 is unexcited or when it is fully extended, the double acting control valve 2025 rests respectively in its first closed position 2040 or in its second closed position 2030. In either case, the hydraulic rail pressure maintains injection needle 2070 at a closed position. Thus, the fuel mixture does not enter into the cylinder (not shown). Conversely, when the piezoelectric element 2010 is excited such that double acting control valve 2025 is in the so-called mid-position with respect to the hollow bore 2050, then there is a pressure drop in the pressurized fuel supply line 2060. This pressure drop results in a pressure differential in the pressurized fuel supply line 2060 between the top and the bottom of the injection needle 2070 so that the injection needle 2070 is lifted allowing for fuel injection into the cylinder (not shown).

It is important to determine and apply an activation voltage with sufficient precision such that, for example, a corresponding valve plug is accurately positioned at the appropriate time in the fuel injection cycle. Thus it is important to be able to detect various problems in the electrical circuit driving the piezoelectric elements. One such problem is a short circuit to chassis ground within, or at the terminals of, one or more of the piezoelectric elements.

It is therefore an object of the present invention to develop the apparatus as defined in the preamble of claim 1 and the method as defined in the preamble of claim 14 to reliably detect a short circuit to chassis ground within, or at the terminals of, one or more of the piezoelectric elements.

This object is achieved, according to the present invention, by way of the features claimed in the characterizing portion of claim 1 (apparatus) and in the characterizing portion of claim 14 (method).

These provide:

the fuel injection system comprises a current diagnosis unit capable of detecting a fault of a current flowing in the driving circuitry within 10 $\mu$sec of the fault occurring; and a current flowing in the driving circuitry is checked in such a manner that a possible fault of the current flowing in the driving circuitry is detected within 10 $\mu$sec of the fault occurring.

A short circuit to ground may have different undesirable effects depending on the location of the short with respect to the piezoelectric element and the piezoelectric element driving circuitry. A short circuit at the positive terminal of the piezoelectric element, e.g. used as an actuator, will prevent it from charging. A short at the positive terminal of one piezoelectric element could also prevent the charging of others that are arranged in parallel with it.

A short to ground at the negative terminal of a piezoelectric element could cause the piezoelectric element to be improperly charged when that actuator has not been selected for charging. For example, in the preferred embodiment of the present invention the selector switch for charging a particular actuator is connected in series with the negative terminal of the piezoelectric element. Shorting out that selector switch would cause the to piezoelectric element be continually charged, even when another piezoelectric element has been selected for charging. A possible consequence of such unplanned charging is the unintentional injection of fuel; a situation which is extremely undesirable.

As a result of a short circuit from a piezoelectric element to chassis ground, electrical current will be diverted from portions of piezoelectric element driving circuitry. However, electrical current will continue to flow in other parts of the piezoelectric element driving circuitry where current would normally be expected to flow.

The present invention examines current flow in different parts of the piezoelectric element driving circuitry to detect a short circuit to chassis ground. The present invention detects a short circuit within the piezoelectric element charging and discharging cycle when current would normally be expected to be flowing through particular branches in the piezoelectric element driving circuitry. A short circuit, however, would cause current to be diverted from one of the branches. The abnormal disparity in the current in the two locations is detected by the present invention and an error signal indicating a short circuit is generated.

For example, during the charging cycle when the charging switch is closed current flows through both, a shunt in the voltage source buffer circuit and through a shunt connected in series at the negative terminal of the piezoelectric element. During that cycle, a current detecting circuit is in place to see whether the expected current is flowing in both locations. If current is flowing in the voltage supply buffer shunt resistor, but not the piezoelectric branch shunt resistor, a short circuit is detected and an error message is generated. To detect whether current is flowing normally at both locations in the circuit, a current signal from measuring points corresponding to the respective shunts is received by a comparator circuit. The comparator circuit outputs a signal to a logic circuit representing the difference between the current flows at the two shunts. If the difference in the two current flows is greater than a predetermined maximum then the logic circuit generates an appropriate error signal.

Advantageous developments of the present invention are evident from the dependent claims, the description below, and the figures.

The invention will be explained below in more detail with reference to exemplary embodiments, referring to the figures in which.

Figure 1:
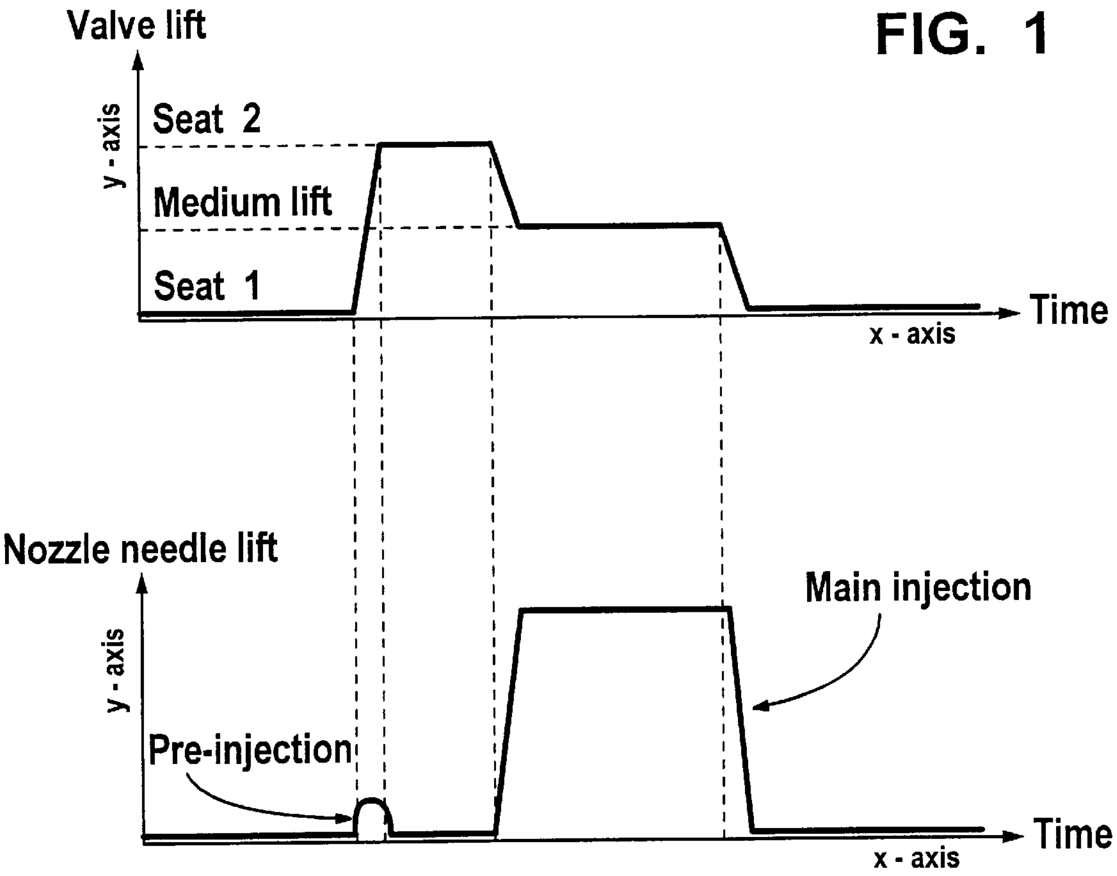
FIG. 1 shows a schematic profile of an exemplary control valve stroke.

FIG. 1 shows a double graph representing a schematic profile of an exemplary control valve stroke, to illustrate the operation of a double acting control valve. In the upper graph of FIG. 1, the x-axis represents time, and the y-axis represents displacement of the valve plug (valve lift). In the lower graph of FIG. 1, the x-axis once again represents time, while the y-axis represents a nozzle needle lift to provide fuel flow, resulting from the valve lift of the upper graph. The upper and lower graphs are aligned with one another to coincide in time, as represented by the respective x-axises.

During an injection cycle, the piezoelectric element is charged resulting in an expansion of the piezoelectric element, as will be described in greater detail, and causing the corresponding valve plug to move from the first closed position to the second closed position for a pre-injection stroke, as shown in the upper graph of FIG. 1. The lower graph of FIG. 1 shows a small injection of fuel that occurs as the valve plug moves between the two seats of the double acting control valve, opening and closing the valve as the plug moves between the seats.

In general, the charging of the piezoelectric element can be done in two steps. The first step is to charge the element to a certain voltage causing the control valve to open. The second step is to further charge the element causing the control valve to close again as the valve plug comes into contact with the second closed position. Between both steps a time delay may be employed.

After a preselected period of time, a discharging operation is then performed, as will be explained in greater detail below, to reduce the charge within the piezoelectric element so that it contracts, as will also be described in greater detail, causing the valve plug to move away from the second closed position, and hold at a point between the two seats. The activation voltage within the piezoelectric element is to reach a value that equals $U_{opt}$ to correspond to a maximum fuel flow during the period of time allocated to a main injection. The upper and lower graphs of FIG. 1 show the holding of the valve lift at a intermediary point, resulting in a main fuel injection.

At the end of the period of time for the main injection, the piezoelectric element is discharged to an activation voltage of zero, resulting in further contraction of the piezoelectric element, to cause the valve plug to move away from the intermediary position, towards the first closed position, closing the valve and stopping fuel flow, as shown in the upper and lower graphs of FIG. 1. At this time, the valve plug will once again be in a position to repeat another pre-injection, main injection cycle, as just described above. Of course, any other injection cycle can be performed.

Figure 2:
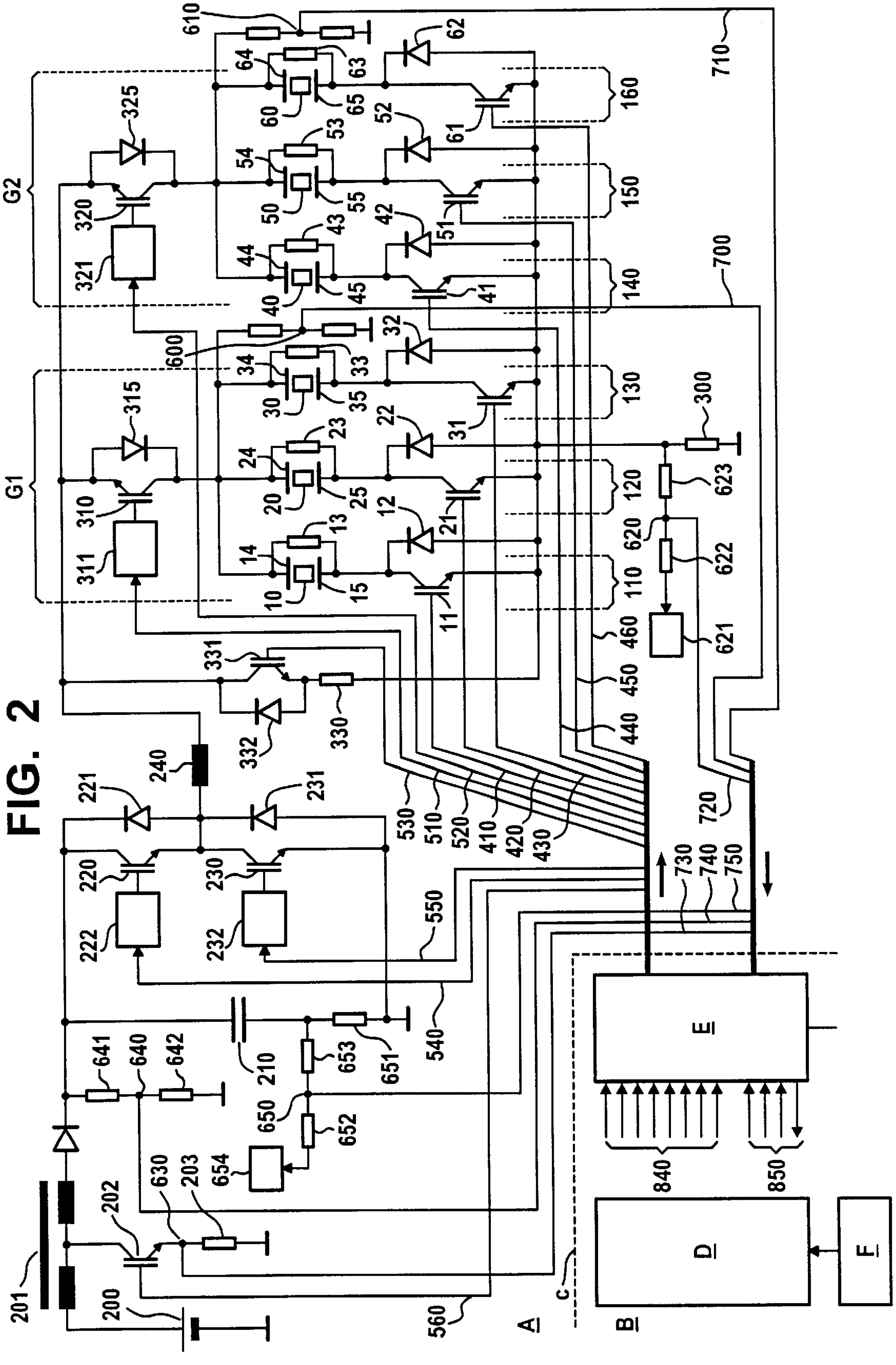
FIG. 2 shows a block diagram of an exemplary embodiment of an arrangement in which the present invention may be implemented.

FIG. 2 provides a block diagram of an exemplary embodiment of an arrangement in which the present invention may be applied.

In FIG. 2 there is a detailed area A and a non-detailed area B, the separation of which is indicated by a dashed line c. The detailed area A comprises a circuit for charging and discharging piezoelectric elements 10, 20, 30, 40, 50 and 60. In the example being considered these piezoelectric elements 10, 20, 30, 40, 50 and 60 are actuators in fuel injection nozzles (in particular in so-called common rail injectors) of an internal combustion engine. Piezoelectric elements can be used for such purposes because, as is known, and as discussed above, they possess the property of contracting or expanding as a function of a voltage applied thereto or occurring therein. The reason to take six piezoelectric elements 10, 20, 30, 40, 50 and 60 in the embodiment described is to independently control six cylinders within a combustion engine; hence, any other number of piezoelectric elements might be suitable for any other purpose.

The non-detailed area B comprises a control unit D and a activation IC E by both of which the elements within the detailed area A are controlled, as well as a measuring system F for measuring system characteristics. Activation IC E receives various measurements of voltages and currents from throughout the rest of the piezoelectric element driving circuitry. According to the present invention, the control unit D and activation IC E are programmed to control activation voltages and the activation timing for the piezoelectric elements. The control unit D and/or activation IC E are also programmed to monitor various voltages and currents throughout the piezoelectric element driving circuitry.

The following description firstly introduces the individual elements within the detailed area A. Then, the procedures of charging and discharging piezoelectric elements 10, 20, 30, 40, 50, 60 are described in general. Finally, the ways both procedures are controlled and monitored by means of control unit D and activation IC E are described in detail.

The circuit within the detailed area A comprises six piezoelectric elements 10, 20, 30, 40, 50 and 60. The piezoelectric elements 10, 20, 30, 40, 50 and 60 are distributed into a first group G1 and a second group G2, each comprising three piezoelectric elements (i.e. piezoelectric elements 10, 20 and 30 in the first group G1 resp. 40, 50 and 60 in the second group G2). Groups G1 and G2 are constituents of circuit parts connected in parallel with one another. Group selector switches 310, 320 can be used to establish which of the groups G1, G2 of piezoelectric elements 10, 20 and 30 resp. 40, 50 and 60 will be discharged in each case by a common charging and discharging apparatus (however, the group selector switches 310, 320 are meaningless for charging procedures, as is explained in further detail below).

The group selector switches 310, 320 are arranged between a coil 240 and the respective groups G1 and G2 (the coil-side terminals thereof) and are implemented as transistors. Side drivers 311, 321 are implemented which transform control signals received from the activation IC E into voltages which are eligible for closing and opening the switches as required.

Diodes 315 and 325 (referred to as group selector diodes), respectively, are provided in parallel with the group selector switches 310, 320. If the group selector switches 310, 320 are implemented as MOSFETs or IGBTS, for example, these group selector diodes 315 and 325 can be constituted by the parasitic diodes themselves. The diodes 315, 325 bypass the group selector switches 310, 320 during charging procedures. Hence, the functionality of the group selector switches 310, 320 is reduced to select a group G1, G2 of piezoelectric elements 10, 20 and 30, resp. 40, 50 and 60 for a discharging procedure only.

Within each group G1 resp. G2 the piezoelectric elements 10, 20 and 30, resp. 40, 50 and 60 are arranged as constituents of piezo branches 110, 120 and 130 (group GI) and 140, 150 and 160 (group G2) that are connected in parallel. Each piezo branch comprises a series circuit made up of a first parallel circuit comprising a piezoelectric element 10, 20, 30, 40, 50 resp. 60 and a resistor 13, 23, 33, 43, 53 resp. 63 (referred to as branch resistors) and a second parallel circuit made up of a selector switch implemented as a transistor 11, 21, 31, 41, 51 resp. 61 (referred to as branch selector switches) and a diode 12, 22, 32, 42, 52 resp. 62 (referred to as branch diodes).

The branch resistors 13, 23, 33, 43, 53 resp. 63 cause each corresponding piezoelectric element 10, 20, 30, 40, 50 resp. 60 during and after a charging procedure to continuously discharge themselves, since they connect both terminals of each capacitive piezoelectric element 10, 20, 30, 40, 50, resp. 60 one to another. However, the branch resistors 13, 23, 33, 43, 53 resp. 63 are sufficiently large to make this procedure slow compared to the controlled charging and discharging procedures as described below. Hence, it is still a reasonable assumption to consider the charge of any piezoelectric element 10, 20, 30, 40, 50 or 60 as unchanging within a relevant time after a charging procedure (the reason to nevertheless implement the branch 30 resistors 13, 23, 33, 43, 53 and 63 is to avoid remaining charges on the piezoelectric elements 10, 20, 30, 40, 50 and 60 in case of a breakdown of the system or other exceptional situations). Hence, the branch resistors 13, 23, 33, 43, 53 and 63 may be neglected in the following description.

The branch selector switch/branch diode pairs in the individual piezo branches 110, 120, 130, 140, 150 resp. 160, i.e. selector switch 11 and diode 12 in piezo branch 110, selector switch 21 and diode 22 in piezo branch 120, and so on, can be implemented using electronic switches (i.e. transistors) with parasitic diodes, for example MOSFETs or IGBTs (as stated above for the group selector switch/diode pairs 310 and 315 resp. 320 and 325).

The branch selector switches 11, 21, 31, 41, 51 resp. 61 can be used to establish which of the piezoelectric elements 10, 20, 30, 40, 50 or 60 will be charged in each case by a common charging and discharging apparatus: in each case, the piezoelectric elements 10, 20, 30, 40, 50 or 60 that are charged are all those whose branch selector switches 11, 21, 31, 41, 51 or 61 are closed during the charging procedure which is described below. Usually, at any time, only one of the branch selector switches will be closed.

The branch diodes 12, 22, 32, 42, 52 and 62 serve for bypassing the branch selector switches 11, 21, 31, 41, 51 resp. 61 during discharging procedures. Hence, in the example considered for charging procedures any individual piezoelectric element can be selected, whereas for discharging procedures either the first group G1 or the second group G2 of piezoelectric elements 10, 20 and 30 resp. 40, 50 and 60 or both have to be selected.

Returning to the piezoelectric elements 10, 20, 30, 40, 50 and 60 themselves, the branch selector piezo terminals 15, 25, 35, 45, 55 resp. 65 may be connected to ground either through the branch selector switches 11, 21, 31, 41, 51 resp. 61 or through the corresponding diodes 12, 22, 32, 42, 52 resp. 62 and in both cases additionally through resistor 300.

The purpose of resistor 300 is to measure the currents that flow during charging and discharging of the piezoelectric elements 10, 20, 30, 40, 50 and 60 between the branch selector piezo terminals 15, 25, 35, 45, 55 resp. 65 and the ground. A knowledge of these currents allows a controlled charging and discharging of the piezoelectric elements 10, 20, 30, 40, 50 and 60. In particular, by closing and opening charging switch 220 and discharging switch 230 in a manner dependent on the magnitude of the currents, it is possible to set the charging current and discharging current to predefined average values and/or to keep them from exceeding or falling below predefined maximum and/or minimum values as is explained in further detail below.

In the example considered, the measurement itself further requires a voltage source 621 which supplies a voltage of 5 V DC, for example, and a voltage divider implemented as two resistors 622 and 623. This is in order to prevent the activation IC E (by which the measurements are performed)

from negative voltages which might otherwise occur on measuring point 620 and which cannot be handled be means of activation IC E: such negative voltages are changed into positive voltages by means of addition with a positive voltage setup which is supplied by said voltage source 621 and voltage divider resistors 622 and 623.

The other terminal of each piezoelectric element 10, 20, 30, 40, 50 and 60, i.e. the group selector piezo terminal 14, 24, 34, 44, 54 resp. 64, may be connected to the plus pole of a voltage source via the group selector switch 310 resp. 320 or via the group selector diode 315 resp. 325 as well as via a coil 240 and a parallel circuit made up of a charging switch 220 and a charging diode 221, and alternatively or additionally connected to ground via the group selector switch 310 resp. 320 or via diode 315 resp. 325 as well as via the coil 240 and a parallel circuit made up of a discharging switch 230 or a discharging diode 231. Charging switch 220 and discharging switch 230 are implemented as transistors, for example which are controlled via side drivers 222 resp. 232.

The voltage source comprises an .element having capacitive properties which, in the example being considered, is the (buffer) capacitor 210. Capacitor 210 is charged by a battery 200 (for example a motor vehicle battery) and a DC voltage converter 201 downstream therefrom. DC voltage converter 201 converts the battery voltage (for example, 12 V) into substantially any other DC voltage (for example 250 V), and charges capacitor 210 to that voltage. DC voltage converter 201 is controlled by means of transistor switch 202 and resistor 203 which is utilized for current measurements taken from a measuring point 630.

For cross check purposes, a further current measurement at a measuring point 650 is allowed by activation IC E as well as by resistors 651, 652 and 653 and a 5 V DC voltage source 654, for example; moreover, a voltage measurement at a measuring point 640 is allowed by activation IC E as well as by voltage dividing resistors 641 and 642.

Finally, a resistor 330 (referred to as total discharging resistor), a stop switch implemented as a transistor 331 (referred to as stop switch), and a diode 332 (referred to as total discharging diode) serve to discharge the piezoelectric elements 10, 20, 30, 40, 50 and 60 (if they happen to be not discharged by the "normal" discharging operation as described further below) Stop switch 331 is preferably closed after "normal" discharging procedures (cycled discharging via discharge switch 230). It thereby connects piezoelectric elements 10, 20, 30, 40, 50 and 60 to ground through resistors 330 and 300, and thus removes any residual charges that might remain in piezoelectric elements 10, 20, 30, 40, 50 and 60. The total discharging diode 332 prevents negative voltages from occurring at the piezoelectric elements 10, 20, 30, 40, 50 and 60, which might in some circumstances be damaged thereby.

Charging and discharging of all the piezoelectric elements 10, 20, 30, 40, 50 and 60 or any particular one is accomplished by way of a single charging and discharging apparatus (common to all the groups and their piezoelectric elements). In the example being considered, the common charging and discharging apparatus comprises battery 200, DC voltage converter 201, capacitor 210, charging switch 220 and discharging switch 230, charging diode 221 and discharging diode 231 and coil 240.

The charging and discharging of each piezoelectric element works the same way and is explained in the following while referring to the first piezoelectric element 10 only.

Figure 3A:
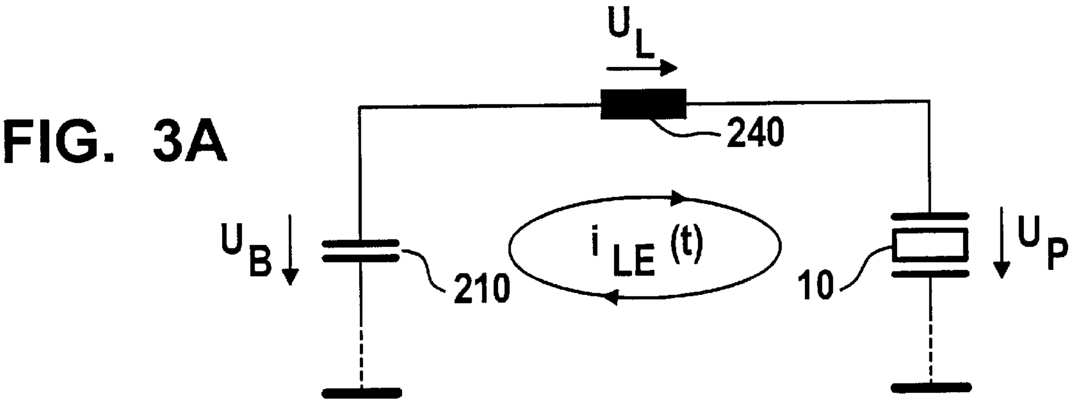
FIG. 3A shows a depiction to explain the conditions occurring during a first charging phase (charging switch 220 closed) in the circuit of FIG. 2.
Figure 3B:
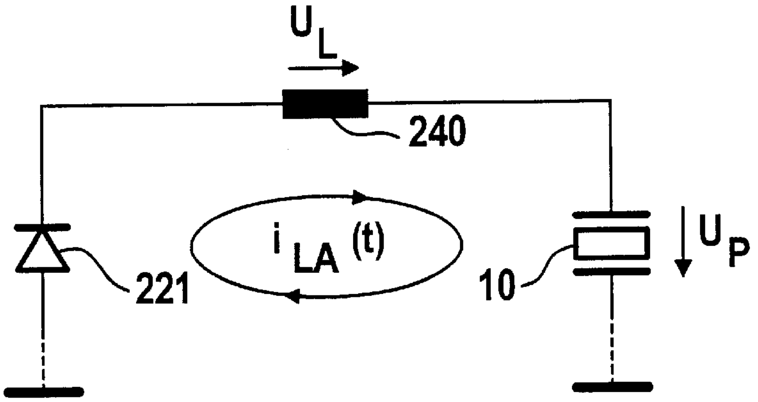
FIG. 3B shows a depiction to explain the conditions occurring during a second charging phase (charging switch 220 open again) in the circuit of FIG. 2.

The conditions occurring during the charging and discharging procedures are explained with reference to FIGS. 3A through 3D, of which FIGS. 3A and 3B illustrate the charging of piezoelectric element 10, and FIGS. 3C and 3D the discharging of piezoelectric element 10.

The selection of one or more particular piezoelectric elements 10, 20, 30, 40, 50 or 60 to be charged or discharged, the charging procedure as described in the following as well as the discharging procedure are driven by activation IC E and control unit D by means of opening or closing one or more of the above introduced switches 11, 21, 31, 41, 51, 61; 310, 320; 220, 230 and 331. The interactions between the elements within the detailed area A on the on hand and activation IC E and control unit D on the other hand are described in detail further below.

Concerning the charging procedure, firstly any particular piezoelectric element 10, 20, 30, 40, 50 or 60 which is to be charged has to be selected. In order to exclusively charge the first piezoelectric element 10, the branch selector switch 11 of the first branch 110 is closed, whereas all other branch selector switches 21, 31, 41, 51 and 61 remain opened. In order to exclusively charge any other piezoelectric element 20, 30, 40, 50, 60 or in order to charge several ones at the same time they would be selected by closing the corresponding branch selector switches 21, 31, 41, 51 and/or 61.

Then, the charging procedure itself may take place:

Generally, within the example considered, the charging procedure requires a positive potential difference between capacitor 210 and the group selector piezo terminal 14 of the first piezoelectric element 10. However, as long as charging switch 220 and discharging switch 230 are open no charging or discharging of piezoelectric element 10 occurs. In this state, the circuit shown in FIG. 2 is in a steady-state condition, i.e. piezoelectric element 10 retains its charge state in substantially unchanged fashion, and no currents flow.

In order to charge the first piezoelectric element 10, charging switch 220 is closed. Theoretically, the first piezoelectric element 10 could become charged just by doing so. However, this would produce large currents which might damage the elements involved. Therefore, the occurring currents are measured at measuring point 620 and switch 220 is opened again as soon as the detected currents exceed a certain limit. Hence, in order to achieve any desired charge on the first piezoelectric element 10, charging switch 220 is repeatedly closed and opened whereas discharging switch 230 remains open.

In more detail, when charging switch 220 is closed, the conditions shown in FIG. 3A occur, i.e. a closed circuit comprising a series circuit made up of piezoelectric element 10, capacitor 210, and coil 240 is formed, in which a current $i_{LE}$ (t) flows as indicated by arrows in FIG. 3A. As a result of this current flow both positive charges are brought to the group selector piezo terminal 14 of the first piezoelectric element 10 and energy is stored in coil 240.

When charging switch 220 opens shortly (for example, a few $\mu$s) after it has closed, the conditions shown in FIG. 3B occur: a closed circuit comprising a series circuit made up of piezoelectric element 10, charging diode 221, and coil 240 is formed, in which a current $i_{LA}$ (t) flows as indicated by arrows in FIG. 3B. The result of this current flow is that energy stored in coil 240 flows into piezoelectric element 10. Corresponding to the energy delivery to the piezoelectric element 10, the voltage occurring in the latter, and its external dimensions, increase. Once energy transport has taken place from coil 240 to piezoelectric element 10, the steady-state condition of the circuit, as shown in FIG. 2 and already described, is once again attained.

At that time, or earlier, or later (depending on the desired time profile of the charging operation), charging switch 220 is once again closed and opened again, so that the processes described above are repeated. As a result of the re-closing and re-opening of charging switch 220, the energy stored in piezoelectric element 10 increases (the energy already stored in the piezoelectric element 10 and the newly delivered energy are added together), and the voltage occurring at the piezoelectric element 10, and its external dimensions, accordingly increase.

If the aforementioned closing and opening of charging switch 220 are repeated numerous times, the voltage occurring at the piezoelectric element 10, and the expansion of the piezoelectric element 10, rise in steps.

Once charging switch 220 has closed and opened a predefined number of times, and/or once piezoelectric element 10 has reached the desired charge state, charging of the piezoelectric element is terminated by leaving charging switch 220 open.

Concerning the discharging procedure, in the example considered, the piezoelectric elements 10, 20, 30, 40, 50 and 60 are discharged in groups (G1 and/or G2) as follows:

Firstly, the group selector switch(es) 310 and/or 320 of the group or groups G1 and/or G2 the piezoelectric elements of which are to be discharged are closed (the branch selector switches 11, 21, 31, 41, 51, 61 do not affect the selection of piezoelectric elements 10, 20, 30, 40, 50, 60 for the discharging procedure, since in this case they are bypassed by the branch diodes 12, 22, 32, 42, 52 and 62). Hence, in order to discharge piezoelectric element 10 as a part of the first group G1, the first group selector switch 310 is closed.

Figure 3C:
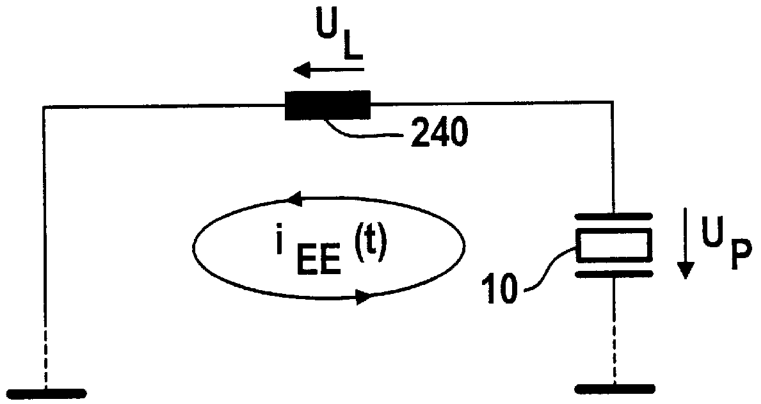
FIG. 3C shows a depiction to explain the conditions occurring during a first discharging phase (discharging switch 230 closed) in the circuit of FIG. 2.

When discharging switch 230 is closed, the conditions shown in FIG. 3C occur: a closed circuit comprising a series circuit made up of piezoelectric element 10 and coil 240 is formed, in which a current $i_{EE}$ (t) flows as indicated by arrows in FIG. 3C. The result of this current flow is that the energy (a portion thereof) stored in the piezoelectric element is transported into coil 240. Corresponding to the energy transfer from piezoelectric element 10 to coil 240, the voltage occurring at the piezoelectric element 10, and its external dimensions, decrease.

Figure 3D:
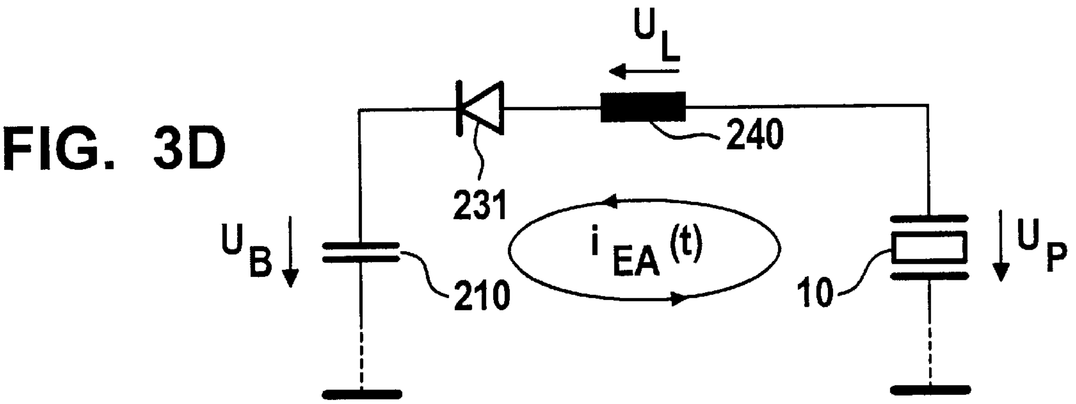
FIG. 3D shows a depiction to explain the conditions occurring during a second discharging phase (discharging switch 230 open again) in the circuit of FIG. 2.

When discharging switch 230 opens shortly (for example, a few $\mu$s) after it has closed, the conditions shown in FIG. 3D occur: a closed circuit comprising a series circuit made up of piezoelectric element 10, capacitor 210, discharging diode 231, and coil 240 is formed, in which a current $i_{EA}$ (t) flows as indicated by arrows in FIG. 3D. The result of this current flow is that energy stored in coil 240 is fed back into capacitor 210. Once energy transport has taken place from coil 240 to capacitor 210, the steady-state condition of the circuit, as shown in FIG. 2 and already described, is again attained.

At that time, or earlier, or later (depending on the desired time profile of the discharging operation), discharging switch 230 is once again closed and opened again, so that the processes described above are repeated. As a result of the re-closing and re-opening of discharging switch 230, the energy stored in piezoelectric element 10 decreases further, and the voltage occurring at the piezoelectric element, and its external dimensions, also accordingly decrease.

If the aforementioned closing and opening of discharging switch 230 are repeated numerous times, the voltage occurring at the piezoelectric element 10, and the expansion of the piezoelectric element 10, decrease in steps.

Once discharging switch 230 has closed and opened a predefined number of times, and/or once the piezoelectric element has reached the desired discharge state, discharging of the piezoelectric element 10 is terminated by leaving discharging switch 230 open.

The interaction between activation IC E and control unit D on the one hand and the elements within the detailed area A on the other hand is performed by control signals sent from activation IC E to elements within the detailed area A via branch selector control lines 410, 420, 430, 440, 450, 460, group selector control lines 510, 520, stop switch control line 530, charging switch control line 540 and discharging switch control line 550 and control line 560. On the other hand, there are sensor signals obtained on measuring points 600, 610, 620, 630, 640, 650 within the detailed area A which are transmitted to activation IC E via sensor lines 700, 710, 720, 730, 740, 750.

The control lines are used to apply or not to apply voltages to the transistor bases in order to select piezoelectric elements 10, 20, 30, 40, 50 or 60, to perform charging or discharging procedures of single or several piezoelectric elements 10, 20, 30, 40, 50, 60 by means of opening and closing the corresponding switches as described above. The sensor signals are particularly used to determine the resulting voltage of the piezoelectric elements 10, 20 and 30, resp. 40, 50 and 60 from measuring points 600 resp. 610 and the charging and discharging currents from measuring point 620.

Figure 4A:
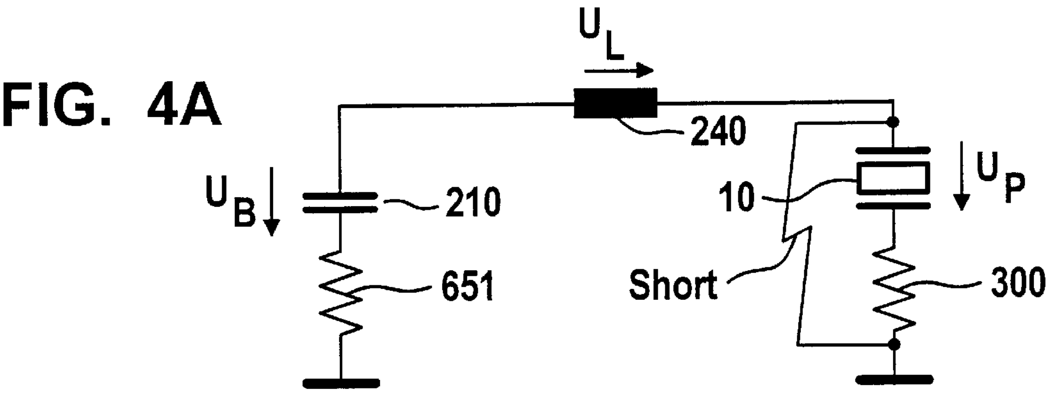
FIG. 4A shows a short circuit condition on the positive terminal of the piezoelectric element while the charging switch is closed during the charging phase, as depicted in FIG. 3A.
Figure 4B:
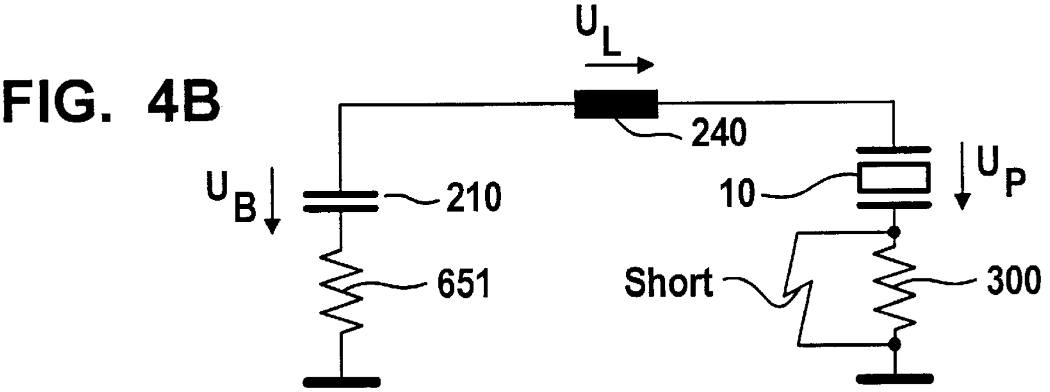
FIG. 4B shows a short circuit condition on the negative terminal of the piezoelectric element while the charging switch is closed during the charging phase, as depicted in FIG. 3A.

FIGS. 4A through 4D depict two phases in the charging and discharging cycle in which abnormal currents can be measured to detect short circuits according to the present invention. FIGS. 4A and 4B depict the same phase in the charging cycle as FIG. 3A, when the charging switch is closed. FIGS. 4A and 4B shows how the circuit is changed when a short circuit occurs either from the positive (FIG. 4A) or negative (FIG. 4B) terminal of the piezoelectric element to chassis ground. It can be seen that in either case current will continue to flow in a clockwise direction through buffer shunt resistor 651 and buffer capacitor 210, but that current will not flow through piezoelectric shunt resistor 300. Under normal conditions, without a short circuit, current would flow through both shunt resistors 651 and 300.

Figure 4C:
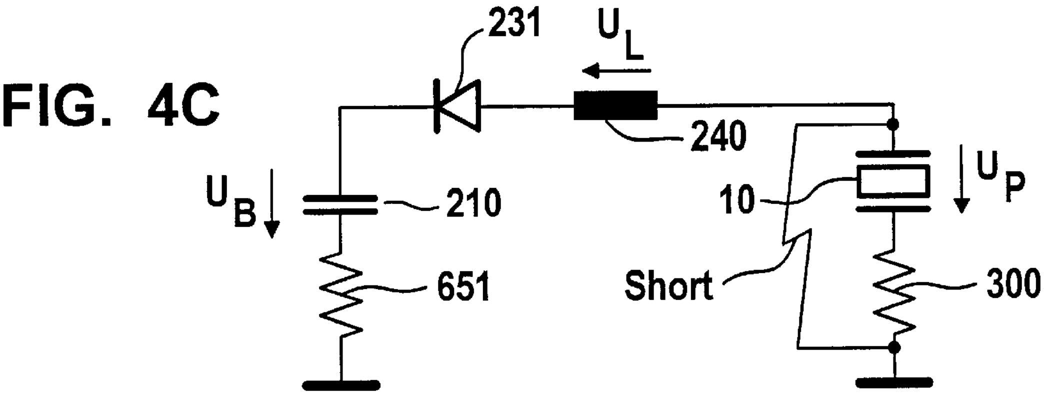
FIG. 4C shows a short circuit condition on the positive terminal of the piezoelectric element while. the discharging switch is open during the discharging phase, as depicted in FIG. 3D.
Figure 4D:
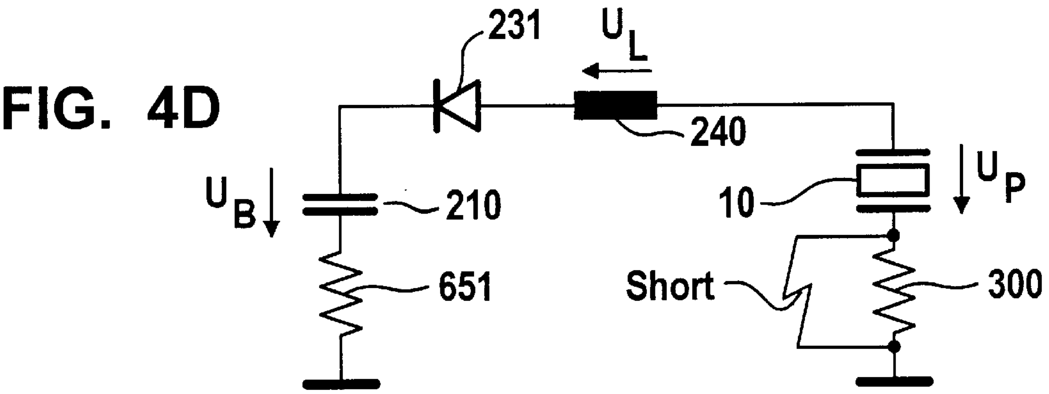
FIG. 4D shows a short circuit condition on the negative terminal of the piezoelectric element while the discharging switch is open during the discharging phase, as depicted in FIG. 3D.

FIGS. 4C and 4D depict the same phase in the discharging cycle as FIG. 3D, when the discharging switch is open. FIGS. 4C and 4D show how the circuit is changed when a short circuit occurs either from the positive (FIG. 4C) or negative (FIG. 4D) terminal of the piezoelectric element to chassis ground. In this phase of the cycle, current will continue to flow in a counter-clockwise direction through the buffer capacitor 210 and buffer shunt resistor 651, but will not flow through piezoelectric shunt resistor 300. Again, under normal conditions, without a short circuit, current would flow through both shunt resistors 651 and 300.

As is indicated in FIG. 2, the control unit D and the activation IC E are connected to each other by means of a parallel bus 840 and additionally by means of a serial bus 850. The parallel bus 840 is particularly used for fast transmission of control signals from control unit D to the activation IC E, whereas the serial bus 850 is used for slower data transfer.

Figure 5:
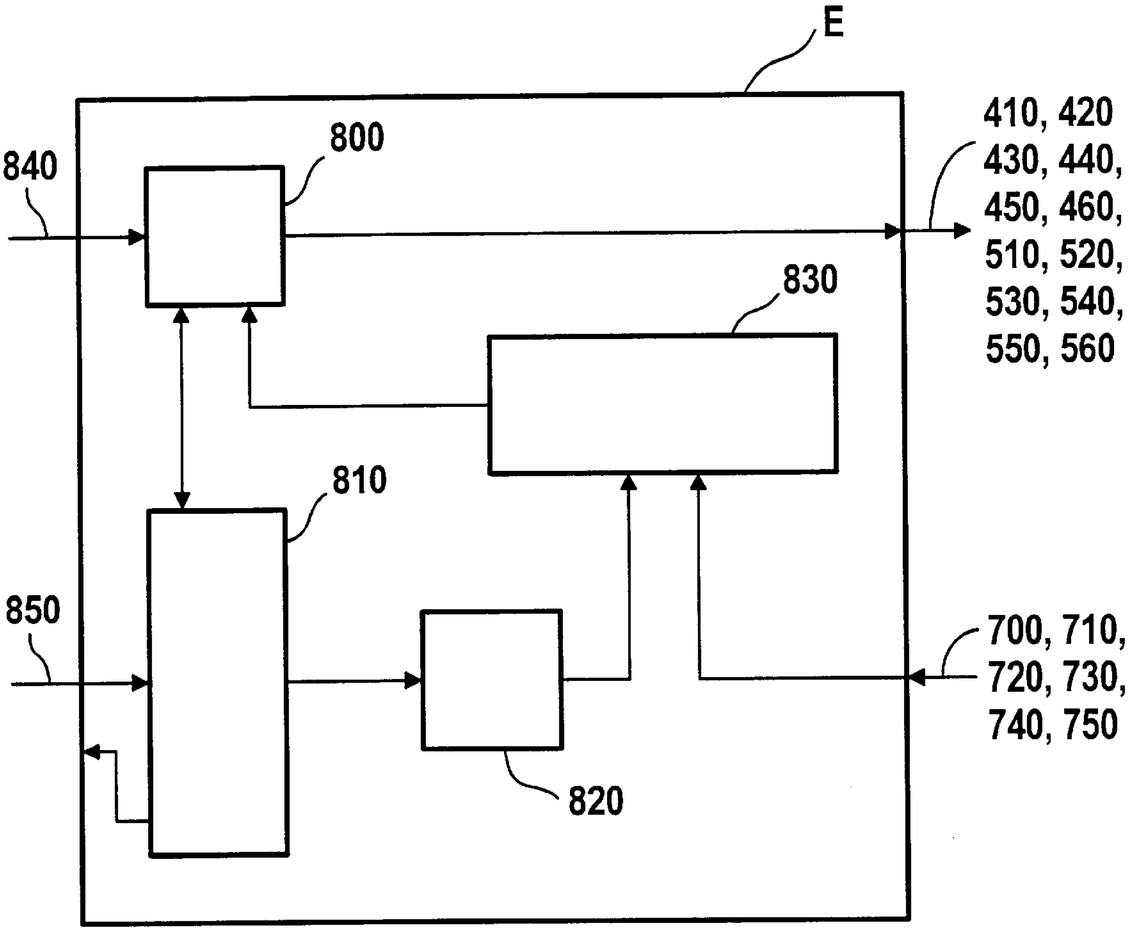
FIG. 5 shows a block diagram of components of the activation IC E which is also shown in FIG. 2.
Figure 6:
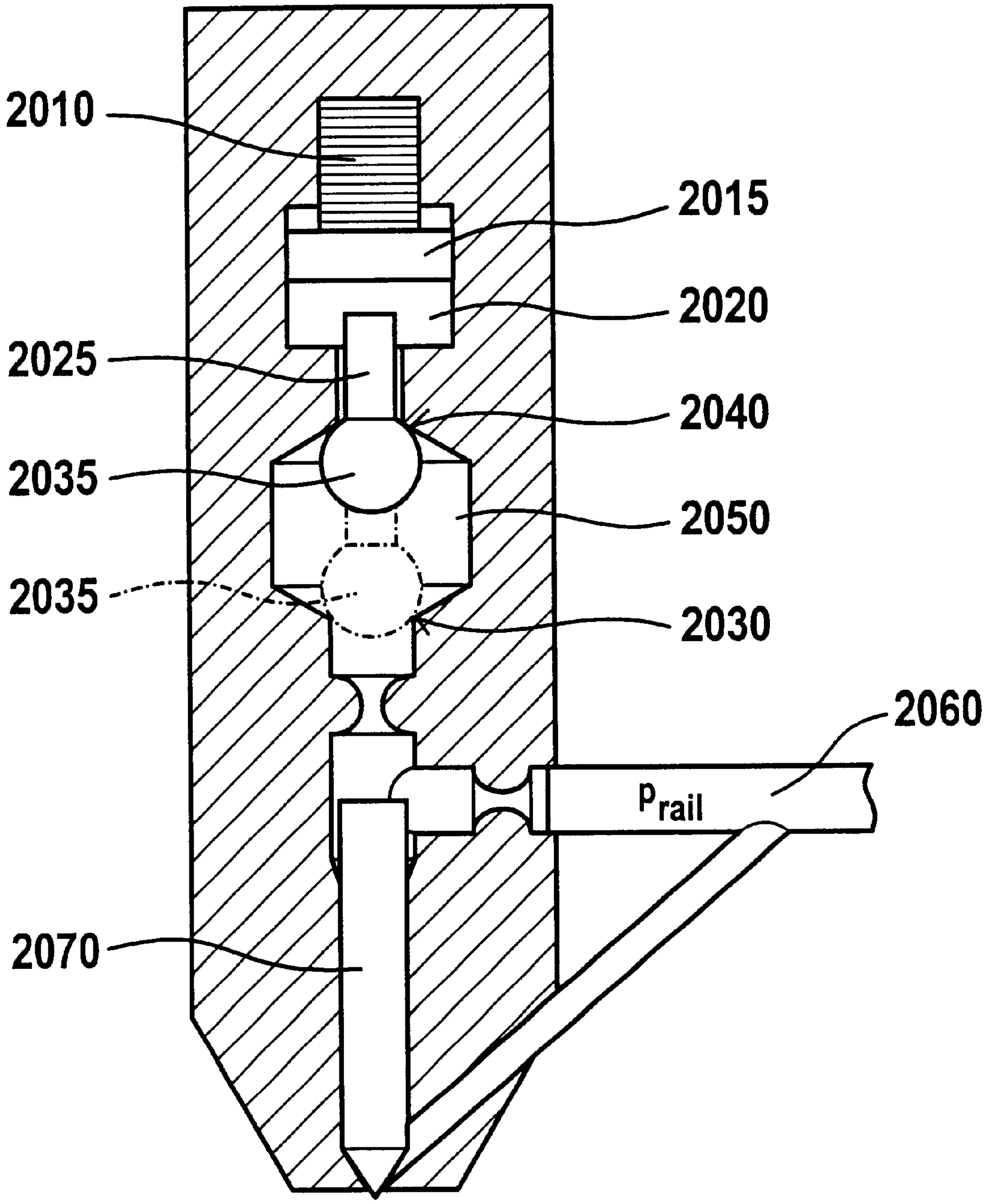
FIG. 6 shows a schematic representation of a fuel injection system using a piezoelectric element as an actuator.

In FIG. 5 some components are indicated, which the activation IC E comprises: a logic circuit 800, RAM memory 810, digital to analog converter system 820 and comparator system 830. Furthermore, it is indicated that the fast parallel bus 840 (used for control signals) is connected to the logic circuit 800 of the activation IC E, whereas the slower serial bus 850 is connected to the RAM memory 810. The logic circuit 800 is connected to the RAM memory 810, to the comparator system 830 and to the signal lines 410, 420, 430, 440, 450 and 460; 510 and 520; 530; 540, 550 and 560. The RAM memory 810 is connected to the logic circuit 800 as well as to the digital to analog converter system 820. The digital to analog converter system 820 is further connected to the comparator system 830. The comparator system 830 is further connected to the sensor lines 700 and 710, 720, 730, 740 and 750 and—as already mentioned—to the logic circuit 800.

The above listed components may be used in a charging procedure for example as follows:

By means of the control unit D a particular piezoelectric element 10, 20, 30, 40, 50 or 60 is determined which is to be charged to a certain target voltage. Hence, firstly the value of the target voltage (expressed by a digital number) is transmitted to the RAM memory 810 via the slower serial bus 850. The target voltage can be, for example, the value for $U_{opt}$ used in a main injection. Later or simultaneously, a code corresponding to the particular piezoelectric element 10, 20, 30, 40, 50 or 60 which is to be selected and the address of the desired voltage within the RAM memory 810 is transmitted to the logic circuit 800 via the parallel bus 840. Later on, a strobe signal is sent to the logic circuit 800 via the parallel bus 840 which gives the start signal for the charging procedure.

The start signal firstly causes the logic circuit 800 to pick up the digital value of the target voltage from the RAM memory 810 and to put it on the digital to analog converter system 820 whereby at one analog exit of the converters 820 the desired voltage occurs. Moreover, said analog exit (not shown) is connected to the comparator system 830. In addition hereto, the logic circuit 800 selects either measuring point 600 (for any of the piezoelectric elements 10, 20 or 30 of the first group G1) or measuring point 610 (for any of the piezoelectric elements 40, 50 or 60 of the second group G2) to the comparator system 830. Resulting thereof, the target voltage and the present voltage at the selected piezoelectric element 10, 20, 30, 40, 50 or 60 are compared by the comparator system 830. The results of the comparison, i.e. the differences between the target voltage and the present voltage, are transmitted to the logic circuit 800. Thereby, the logic circuit 800 can stop the procedure as soon as the target voltage and the present voltage are equal to one another.

Secondly, the logic circuit 800 applies a control signal to the branch selector switch 11, 21, 31, 41, 51 or 61 which corresponds to any selected piezoelectric element 10, 20, 30, 40, 50 or 60 so that the switch becomes closed (all branch selector switches 11, 21, 31, 41, 51 and 61 are considered to be in an open state before the onset of the charging procedure within the example described). Then, the logic circuit 800 applies a control signal to the charging switch 220 so that the switch becomes closed. Furthermore, the logic circuit 800 starts (or continues) measuring any currents occurring on measuring point 620. Hereto, the measured currents are compared to any predefined maximum value by the comparator system 830. As soon as the predefined maximum value is achieved by the detected currents, the logic circuit 800 causes the charging switch 220 to open again.

Again, the remaining currents at measuring point 620 are detected and compared to any predefined minimum value. As soon as said predefined minimum value is achieved, the logic circuit 800 causes the charging switch 220 to close again and the procedure starts once again.

The closing and opening of the charging switch 220 is repeated as long as the detected voltage at measuring point 600 or 610 is below the target voltage. As soon as the target voltage is achieved, the logic circuit stops the continuation of the procedure.

The discharging procedure takes place in a corresponding way: Now the selection of the piezoelectric element 10, 20, 30, 40, 50 or 60 is obtained by means of the group selector switches 310 resp. 320, the discharging switch 230 instead of the charging switch 220 is opened and closed and a predefined minimum target voltage is to be achieved.

The timing of the charging and discharging operations and the holding of voltage levels in the piezoelectric elements 10, 20, 30, 40, 50 or 60, as for example, the time of a main injection, can be according to a valve stroke, as shown, for example, in FIG. 2.

It is to be understood that the above given description of the way charging or discharging procedures take place are exemplary only. Hence, any other procedure which utilizes the above described circuits or other circuits might match any desired purpose and any corresponding procedure may be used in place of the above described example.

The target voltages for activating the piezoelectric elements are stored in RAM memory 810. The values stored in the RAM memory 810 include the time period calculations of the metering unit, and initial values for, for example, $U_{opt}$ used as target voltages in charging and discharging procedures, as described above.

The $U_{opt}$ values can change as a function of operating characteristics of the fuel injection system, such as, for example, fuel pressure, as fully described in co-pending application titled “Method and Apparatus for Charging a Piezoelectric Element”, filed on the same day as this application. Thus, the values stored in the RAM memory 810 include delta values added to or subtracted from the set initial $U_{opt}$ voltages, as a function of measured fuel pressure, as described in co-pending application titled “Method and Apparatus for Charging a Piezoelectric Element”, filed on the same day as this application. The stored target voltages can also be modified and continuously optimized as described in co-pending application titled “Online Optimization of Injection Systems Having Piezoelectric Elements”, filed on the same day as this application.

The present invention for detecting a short circuit to chassis ground while driving the piezoelectric elements can be readily implemented using the embodiment described above. As discussed above, the present invention detects a short circuit by monitoring currents at different locations in the piezoelectric element driving circuitry. In particular, during the charging phase when the charging switch 220 is closed and during the discharging phase when the discharging switch 230 is open, current should be flowing through both the buffer shunt resistor 651 and the piezoelectric shunt resistor 300 as depicted in FIGS. 3A and 3D. However, when a short circuit occurs from the piezoelectric element to chassis ground no current will be present in piezoelectric shunt resistor 300, as depicted in FIGS. 4A through 4D. Typically, the maximum gradient of the current will be $10A/\mu S$ while the circuit is in charging or discharging mode.

As depicted in FIG. 2, the current across buffer shunt resistor 651 is measured via measuring point 650. The current across piezoelectric shunt resistor 300 is measured via measuring point 620. For the purposes of the present invention the current measurements from measuring points 620 and 650 are compared by comparator system 830 and a signal representing the difference in the two currents is generated and supplied to logic circuit 800.

Logic circuit 800 will monitor this difference signal during the driving cycle phases discussed above, when it is known that the current values should be roughly equal in the absence of a short circuit. When logic circuit 800 applies a control signal to close the charging switch 220 during the charging cycle, and when logic circuit 800 applies a control signal to open the discharging switch 230 during the discharging cycle, the logic circuit 800 monitors the current difference signal from the comparator system 830. If the current difference signal is more than a predetermined maximum, the logic circuit 800 generates an error signal indicating that a short circuit has occurred. In an embodiment of the invention the current diagnosis unit comprises the voltage deviders comprising the resistors 652 and 653 as well as the resistors 622 and 623, the activation IC E as well as control unit D evaluating a detected difference in currents.

The predetermined maximum difference may be set to approximately 1A. Thus with a 10A/μsec current gradient, the threshold value will be met and detectable in 0.1 μsec. More preferably, a maximum predetermined maximum difference will be about 3 to 5A to avoid error detection due to noise in the piezoelectric driving circuitry. With a 3 to 5A limit, the threshold value would be met and detectable in approximately 0.3 to 0.5 μsec. Limit frequencies in the logic circuit 800 and comparator system 830 can delay the short circuit detection time. Typically, the limitations of that detection circuitry will be in the range of 1 to 2 μsec. Thus for the example of a 5A predetermined maximum difference, a detection time would be in the range of 1.5 to 2.5 μsec.

The error signal generated by logic circuit 800 can be used to create an error memory in the activation IC E. Further control unit D and activation IC E can be programmed to cease driving the piezoelectric elements 10, 20, 30, 40, 50, and 60 when such a short circuit error signal is generated. When a short circuit error signal causes the charging and discharging cycle to stop, it is important to ensure that any piezoelectric elements 10, 20, 30, 40, 50 and 60 that have been unintentionally charged be discharged. Therefore, after detecting a short circuit and stopping the driving cycle, activation IC E causes the stop switch 331 and group selector switches 310 and 320 to close for a predetermined period of time to ensure that the any charged piezoelectric elements are fully discharged.

I claim:

1. Fuel injection system with a piezoelectric element (10, 20, 30, 40, 50 or 60) for controlling an amount of injected fuel, by charging and/or discharging the piezoelectric element (10, 20, 30, 40, 50 or 60) using a driving circuitry, characterized in that the fuel injection system comprises a current diagnosis unit capable of detecting a fault of a current flowing in the driving circuitry within 10 μsec of the fault occurring, and in that the current diagnosis unit detects the fault by detecting an input current flowing into the piezoelectric element (10, 20, 30, 40, 50 or 60) and an output current flowing out of the piezoelectric element (10, 20, 30, 40, 50 or 60).

2. Fuel injection system according to claim 1, characterized in that the current diagnosis unit is capable of detecting the fault within 0.1 μsec to 10 μsec of the fault occurring.

3. Fuel injection system according to claim 1, characterized in that the current diagnosis unit is capable of detecting the fault within to 3 μsec of the fault occurring.

4. Fuel injection system according to claim 1, characterized in that the current diagnosis unit discharges all piezoelectric elements if an error is detected.

5. Fuel injection system according to claim 1, characterized in that the current diagnosis unit detects the fault based upon a comparison between the input current and the output current.

6. Fuel injection system according to claim 1, characterized in that the current diagnosis unit searches for the fault only at a predetermined time interval.

7. Fuel injection system according to claim 1, characterized in that the fault includes a short circuit from a piezoelectric element (10, 20, 30, 40, 50, or 60) to ground while driving the piezoelectric element (10, 20, 30, 40, 50, or 60).

8. Fuel injection system according to claim 1, characterized in that the current diagnosis unit comprises a comparator circuit for comparing currents flowing in different parts of the driving circuitry, and a control unit (D) receiving a difference signal from the comparator circuit, the control unit (D) generating an error signal when the difference signal is greater than a predetermined maximum during charging or discharging of the piezoelectric element (10, 20, 30, 40, 50, or 60).

9. Fuel injection system according to claim 8, characterized in that the comparator circuit compares current flow through a buffer circuit and a piezoelectric shunt resistor in series with the piezoelectric element (10, 20, 30, 40, 50, or 60).

10. Fuel injection system according to claim 8, characterized in that the predetermined time in the driving cycle is when the buffer circuit and the piezoelectric shunt resistor both carry a common current in the absence of a short circuit.

11. Fuel injection system according to claim 8, characterized in that the comparator circuit receives a current measurement signal from a measuring point in a voltage divider circuit.

12. Fuel injection system according to claim 8, characterized in that the error signal is recorded as an entry in an error memory.

13. A method for operating a fuel injection system having a piezoelectric element, comprising the steps of:

controlling an amount of injected fuel by charging and discharging the piezoelectric element using a driving circuitry; and checking a current flowing in the driving circuitry so that a possible fault of the current flowing in the circuitry is detected within 10 μsec of an occurrence of the fault.

14. Method for operating a fuel injection system with a piezoelectric element (10, 20, 30, 40, 50 or 60) for controlling an amount of injected fuel, by charging and/or discharging the piezoelectric element (10, 20, 30, 40, 50 or 60) using a driving circuitry, characterized in that a current flowing in the driving circuitry is checked in such a manner that a possible fault of the current flowing in the driving circuitry is detected within 10 μsec of the fault occurring and in that the fault is detected by detecting an input current flowing into the piezoelectric element (10, 20, 30, 40, 50 or 60) and an output current flowing out of the piezoelectric element (10, 20, 30, 40, 50 or 60).

15. A fuel injection system, comprising:

a piezoelectric element configured to control an amount of injected fuel in accordance with a charge and discharge of the piezoelectric element;

a driving circuitry configured to charge and discharge the piezoelectric element; and a current diagnosis unit configured to detect a fault of current flowing in the driving circuitry within 10 μsec of an occurrence of the fault, the current diagnosis unit configured to detect the fault in accordance with a detection of an input current flowing into the piezoelectric element and an output current flowing out of the piezoelectric element.

16. The fuel injection system according to claim 15, wherein the current diagnosis unit is configured to detect the fault within 0.1 μsec to 10 μsec of the occurrence of the fault.

17. The fuel injection system according to claim 15, wherein the current diagnosis unit is configured to detect the fault within 3 μsec of the occurrence of the fault.

18. The fuel injection system according to claim 15, wherein the current diagnosis unit is configured to detect the fault in accordance with a comparison between the input current and the output current.

19. The fuel injection system according to claim 15, wherein the current diagnosis unit is configured to search for the fault only at a predetermined time interval.

20. The fuel injection system according to claim 15, wherein the fault includes a short circuit from the piezoelectric element to ground.

21. The fuel injection system according to claim 15, wherein the current diagnosis unit includes a comparator circuit configured to compare currents flowing indifferent parts of the driving circuitry and a control unit configured to receive a difference signal from the comparator circuit, the control unit configured to generate an error signal if the difference signal is greater than a predetermined maximum during one of charging and discharging the piezoelectric element.

22. The fuel injection system according to claim 21, wherein the comparator circuit is configured to compare current flowing through a buffer circuit and a piezoelectric shunt resistor arranged in series with the piezoelectric element.

23. The fuel injection system according to claim 21, wherein the comparator circuit is configured to receive a current measurement signal from a measuring point in a voltage divider circuit.

24. The fuel injection system according to claim 21, further comprising a memory configured to record the error signal as an entry.

25. The fuel injection system according to claim 15, wherein the current diagnosis unit is configured to discharge the piezoelectric element in accordance with a detected error.

* * * * *